(12) United States Patent
Bernhoff et al.

(10) Patent No.: US 6,204,522 B1
(45) Date of Patent: Mar. 20, 2001

(54) SWITCHING DEVICE

(75) Inventors: Hans Bernhoff; Jan Isberg; Peter Isberg; Åke Öberg; Mark Irwin, all of Västerås (SE)

(73) Assignee: Asea Brown Boveri AB, Vasteras (SE)

( * ) Notice: Subject to any disclaimer, the term of this patent is extended or adjusted under 35 U.S.C. 154(b) by 0 days.

(21) Appl. No.: 09/093,725

(22) Filed: Jun. 9, 1998

(51) Int. Cl.$^7$ ................................................. H01L 31/0312
(52) U.S. Cl. ........................ 257/77; 257/184; 257/461; 257/464
(58) Field of Search ............... 257/77, 184, 461, 257/186, 188, 189, 21, 292, 431, 440, 441, 451, 464

(56) References Cited

U.S. PATENT DOCUMENTS

| | | | |
|---|---|---|---|
| 4,240,088 | * 12/1980 | Myers | 357/19 |
| 4,993,033 | 2/1991 | Lin | 372/30 |
| 5,223,721 | 6/1993 | Iida et al. | 257/77 |
| 5,298,766 | * 3/1994 | Kobashi et al. | 257/77 |
| 5,382,822 | 1/1995 | Stein | 257/410 |
| 5,525,815 | 6/1996 | Einset | 257/77 |
| 5,536,953 | 7/1996 | Dreifus et al. | 257/77 |
| 5,562,769 | 10/1996 | Dreifus et al. | 117/86 |
| 5,592,053 | 1/1997 | Fox et al. | 315/3 |
| 5,656,828 | * 8/1997 | Zachai et al. | 257/77 |

OTHER PUBLICATIONS

Zhu et al., Growth and Characterization of Diamond Films on Nondiamond Substrates for Electronic Applications, Proceedings of the IEEE, vol. 79, No. 5, 1991, pp. 621–646.

* cited by examiner

*Primary Examiner*—Sara Crane
(74) *Attorney, Agent, or Firm*—Connolly Bove Lodge & Hutz (57) ABSTRACT

A device having two opposite terminals interconnected by material layers for switching between a current conducting state and a state blocking transport of charge carriers between the terminals upon applying a voltage there across has as the material layers a first layer made of intrinsic diamond and a second layer arranged next to the first layer. The device switches to the conducting state by providing free charge carriers in the second layer for transport through the diamond layer through the voltage and the blocking state by stopping providing the free charge carriers for the transport. The diamond layer is adapted to take a major part of the voltage across the terminals in the blocking state.

19 Claims, 5 Drawing Sheets

SWITCHING DEVICE

BACKGROUND OF THE INVENTION

The present invention relates to a device having two terminals interconnected by one or more material layers for switching between a current conducting state and a state of blocking transport of charge carriers between the terminals upon applying a voltage thereacross.

Accordingly, the invention relates to a switching device in the broadest sense of this expression and is directed to all types of devices adapted to assume a state, in which they are conducting when a voltage is applied across the terminals and a state in which a transport of charge carriers between the terminals is blocked in spite of a voltage being applied across the terminals. The device may be of the type, in which the voltage in the conducting state has an opposite direction than in the blocking state. The simplest device of this type is a rectifying diode, but the device may also be of the type capable to assume either a conducting state or a blocking state when a voltage is applied across the terminals in one and the same direction.

The definition "terminals interconnected by one or more material layers" is used for limiting the invention with respect to circuit breakers or switching devices obtaining the switching action by breaking and establishing a physical connection between the terminals of the device, i.e. connecting and disconnecting them. In contrast thereto, the physical properties of the material layers in connection with the availability of charge carriers and voltage will decide the state of the device.

A device of this type finds many applications, but the use of such a device for high power applications will hereinafter be discussed for clarity, but not in any way restricting the invention.

A device of this type may be used in equipment for handling high electric power for switching high voltages and currents for instance in circuit breakers, commutators, current valves, surge diverters, current limiters and the like. The breakdown voltage of such a device is in most of these applications considerably lower than the voltage to be held by the position in which the device is arranged in the equipment, so that it is necessary to connect a comparatively large number of such devices in series for distributing the total voltage them. The total voltage may well exceed 100 kV, whereas a single device may for instance have a breakdown voltage of 2–5 kV. A complicated and thus costly equipment is required for controlling such devices. Also, equipment for cooling them has to be rather sophisticated and expensive, especially in high frequency operation, for instance when the device is used in current valves switched according to Pulse Width Modulation (PWM) in converter stations. In fact, the major part of the costs for a converter station is caused by the controlling and cooling equipment, so that it is highly desired to reduce the number of devices required in such stations and other high power applications for saving costs.

SUMMARY OF THE INVENTION

The object of the present invention is to provide a device of the type defined in the introduction reducing the problems of already known devices as discussed above.

This object is according to the invention obtained by providing a device with a first layer made of intrinsic diamond and a second layer arranged next to the first layer and means for switching to the conducting state by providing free charge carriers in the second layer for transport through the diamond layer through said voltage and switching back to the blocking state by terminating the provision of the free charge carriers for the transport. The diamond layer is adapted to take a major part of the voltage across the terminals in the blocking state.

The main benefit of such a device is that diamond has an extremely high breakdown field strength, which means that the number of devices to be connected in series for holding a voltage of a certain magnitude may be reduced considerably with respect to prior art devices. This results in important cost reduction even if such a device itself would be much more expensive than the prior art devices, which for the rest is not any evident fact. It has until now been very difficult to dope diamond, and intrinsic, undoped diamond has not been used in semiconductor devices in the current-conducting, active layers of the device, but it has been seen as a material primarily suited for use in insulating layers, such as as a gate insulator, in which it is possible to benefit from the excellent insulating properties thereof.

However, the present inventors have proved that a layer of intrinsic diamond may function very well in a device of this type, in which the extremely high breakdown field strength of diamond is used in the blocking state of the device. The device may nevertheless conduct a current without generating any high losses in the conducting state thanks to the provision of the free charge carriers in the second layer for allowing current conduction through the diamond layer which has a high conductivity due to the comparatively high charge carrier mobility in intrinsic diamond. "Intrinsic diamond" means that the diamond layer is either undoped or compensation doped or that the dopants are not thermally activated at temperatures of interest.

Furthermore, diamond has the highest known thermal conductivity of any solid near room temperature, which makes it well suited for high power applications, especially as a heat sink in high frequency devices, where cooling can be a limiting factor in achieving greater switching speeds. The high breakdown field strength of diamond means that a diamond layer may be made much thinner than a layer of for instance Si for the same breakdown voltage, which will considerably reduce switching losses and problems with reverse recovery, so that the switching speed may be increased. Additionally, short carrier lifetimes make possible higher switching speeds in a diamond device. Another advantage is that diamond is extremely temperature stable, in the sense that the thermal expansion thereof is very low and it remains an insulator up to very high temperatures due to the large band gap (5,4 eV) thereof, which means that it may function well under high temperature conditions, well up to 1,000 K, so that the device may be used in such applications.

According to a preferred embodiment of the invention the second layer is of a material having a substantially smaller energy gap between the valence band and the conduction band than diamond, and the means is adapted to cause switching to the conducting state and the blocking state by generating free charge carriers in the second layer for injection into the first layer and terminating the generation, respectively. An advantage of such a device is that the smaller band gap in the second layer means that the free charge carriers may be generated more readily and at a much lower cost, i.e. simpler equipment may be used therefor than should the free charge carriers instead be generated in diamond. Another advantage is that such a device may optionally assume the conducting state and the blocking state for the same direction of the voltage or an identical voltage applied across the terminals thereof by simply initiating or terminating the generation of the free charge carriers, so that a current in a determined direction may be switched on and off rapidly without any change in the direction of the voltage.

According to another preferred embodiment of the invention the means for generating free charge carriers is adapted to irradiate the second layer with photon radiation having sufficient energy to create free charge carriers in the second layer. This is one preferred potential means of generating the free charge carriers in the second layer enabling very fast switching of the device.

According to another preferred embodiment of the invention the means is adapted to generate free charge carriers by irradiating the second layer with electrons having an energy sufficiently high for creating free charge carriers in said second layer. This embodiment also results in the possibility of very high switching frequencies for rapid current breaking, and an advantage thereof with respect to the previous embodiment is that it may be easier to obtain higher rates in the generation of free charge carriers.

According to another preferred embodiment of the invention the means for generating free charge carriers in the second layer is arranged to do that by injecting free charge carriers into the second layer. This is a reliable and simple and thereby from an economical point of view favorable way of obtaining the free charge carriers, which may be achieved by connecting a voltage source to the second layer.

According to another preferred embodiment of the invention the device has two second layers separated by the first layer of diamond. In addition to the advantages of a high breakdown field strength combined with a good conductivity discussed above, such a device will have the advantageous feature of being able to optionally assume a blocking or conducting state independently of the direction of the voltage applied thereacross.

According to another preferred embodiment of the invention the means is adapted to provide free charge carriers in the second layer by doping thereof. Accordingly, a material being much easier to dope than diamond may be used for the second layer, and the excessive electrons or holes thereof may be utilized for conducting a current through the diamond layer when the voltage has the "right" direction. This means that the most negative potential is applied on the terminal closest to the second layer when this is doped by donors. Furthermore, this means that the device will be in the blocking state when the voltage is applied in the opposite direction to the direction thereof in the conducting state. Accordingly, "providing free charge carriers" comprises also this case in which the charge carriers in question are always there due to the doping, but they are not provided for transport when the direction of the voltage is not right. This device will function as a rectifying diode.

According to another preferred embodiment of the invention the second layer is at least next to the first layer made of crystalline SiC. It is very advantageous to use SiC next to the first layer for many reasons. An important advantage is that it is easy to form clean interfaces between SiC and diamond, since an epitaxial interface is formed, so that the density of charge carrier traps at the interface will be low and thus the mobility high. Another advantage is that the lattice-match of SiC and diamond is rather good, and SiC has also a low coefficient of thermal expansion, so that such a structure may withstand comparatively high temperatures without any risk of damages at the interface as a consequence of stresses in the interface layers resulting from temperature gradients and thermal cycling. This also means that it will be possible to take advantage of the high temperature stability of diamond. Another advantage of using SiC for the second layer is that it is comparatively easy to dope SiC should this be desired. SiC has also a substantially smaller band gap than diamond, so that it will be easier to generate free charge carriers therein by for instance irradiation by light or electrons.

According to another preferred embodiment of the invention the second layer has two sub-layers, namely a thin first sub-layer of SiC arranged between the first layer and a considerably thicker sub-layer of Si. The technique of growing silicon is well developed and high quality silicon layers may today be grown at higher growth rates and by the use of a less expensive equipment than in case of SiC. The advantages of using SiC next to diamond are primarily associated with the high breakdown strength of the SiC as well as the interface conditions, so that such a structure will in principle, have in operation the same advantageous characteristics as in the case of having the entire second layer of SiC, but it may be easier produced with a required quality. In fact, this structure may be obtained by growing Si, for instance by the use of Chemical Vapor Deposition (CVD) of Si, on a layer of intrinsic diamond, since the carbon of the diamond layer and the Si-atoms will automatically form SiC at the interface, and the expression "said second layer is at least next to the first layer made of crystalline SiC" is defined to include this case. The thickness of this layer can be controlled by thermal processing steps. In the case that the second layer is doped, the intended doping may very well be outside the SiC-layer.

According to another preferred embodiment of the invention the device has between the respective terminal and the first layer a layer next to the first layer of a semiconductor material, and the two layers of semiconductor material are doped according to mutually opposite conductivity-types, n and p, respectively, for conducting a current when a voltage is applied in a forward direction across the terminals by transport of the negative and positive charge carriers provided in the layers of semiconductor material by the doping. A so-called p-i-n-diode with extremely favorable reverse characteristics is in this way obtained. Accordingly, the state of the device depends upon the direction of the voltage applied across the terminals of the device.

According to another preferred embodiment of the invention, which constitutes a further development of the embodiment last mentioned, the means is adapted to cause a switching between a conducting state and a blocking state when a voltage is applied across the terminals in the reverse direction by generating free charge carriers in the form of minority charge carriers in at least one of the layers of semiconductor material and stopping this generation, respectively. By the possibility of generating free charge carriers in the form of minority charge carriers in this way, a device is obtained, which will always be conducting when a voltage is applied thereacross in one direction and which may be either conducting or blocking, i.e. selectively turned on or turned off, when a voltage is applied in the other direction. In some applications it may be desired to nearly instantaneously switch between a blocking and a conducting state without any change of the voltage applied or in a fault situation rapidly reduce a voltage across a component by making a device of this type connected in parallel therewith conducting, and a device of this type will be suitable for such applications.

According to another preferred embodiment of the invention the first layer of diamond has a substantially larger thickness than the other layers of the device. Since the layer of diamond is adapted to take the major part of the voltage over the device in the blocking state thereof the other layers may be made thin with respect thereto.

Further advantages and advantageous features of the invention will appear from the following description and the other dependent claims.

BRIEF DESCRIPTION OF THE DRAWINGS

With reference to the appended drawings, below follows a specific description of preferred embodiments of the invention cited as examples.

In the drawings.

DETAILED DESCRIPTION OF PREFERRED EMBODIMENTS

Figure 1:
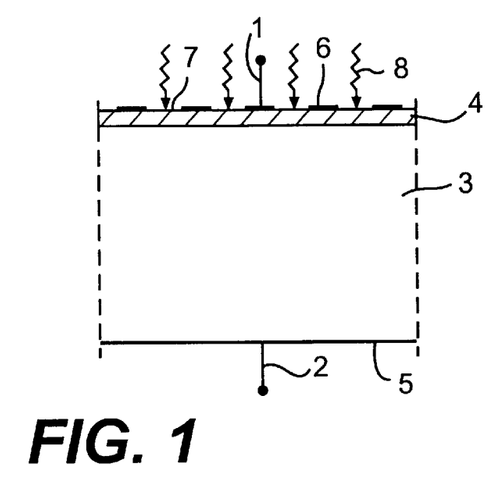
FIG. 1 is a schematic cross-section view of a semiconductor device according to a first preferred embodiment of the invention.

A device according to a preferred embodiment of the invention is very schematically shown in FIG. 1, and this device has two terminals, 1, 2 for connecting the device to an electric current path. The device has a first layer 3 of intrinsic diamond, which may typically have a thickness of 100 $\mu$m, and a superimposed second, thinner layer 4 of a semiconductor material, here crystalline SiC. The SiC-layer 4 could have a typical thickness of 1 $\mu$m–10 $\mu$m. A metal contact 5, 6 connects the respective terminal to the diamond layer 3 and the SiC-layer 4, respectively. The metal contact 6 has vents allowing for penetration of incident radiation through the surfaces 7 of the second layer 4 located thereunder and into this layer. Characteristics of this device having nothing to do with the present invention, such as passivation layers, have been omitted for the sake of clarity.

The device has also a means indicated by the arrows 8 for generating free charge carriers in the second layer 4 by irradiating the second layer 4 with photons or electrons having a sufficient energy for creating free charge carriers in the second layer. The SiC-layer 4 is of any conceivable polytype, for instance 6 H, and the energy gap between the valence band and the conductance band will vary with the polytype, but it will typically be approximately 3 eV, so that the light or electrons have to have an energy of this value or slightly exceeding it for generating the free charge carriers. When the device is irradiated with photons or electrons and a voltage is applied across the terminals 1, 2 and the device is in the conducting state (for example due to carrier generation resulting from irradiation) having a comparatively low on-state voltage, preferably in the order of 10 V, and the free charge carriers generated in the second layer 4 will be transported through the diamond layer 3 having a high mobility to the terminal 2. The contact 5 may be a so-called injecting contact resulting in the creation of charge carriers of opposite sign transported in the opposite direction to the terminal 1. This device may be called a FTO-device (Fast Turn Off-device), since it may be turned off in the order of us by stopping the generation of free charge carriers in the second layer 4 as a result of ceasing the photon or electron irradiation. The device will then be able to hold very high voltages, well in the order of 50 kV, built up across the terminals 1, 2 in the blocking state thanks to the extremely high breakdown field strength of diamond.

Figure 2:
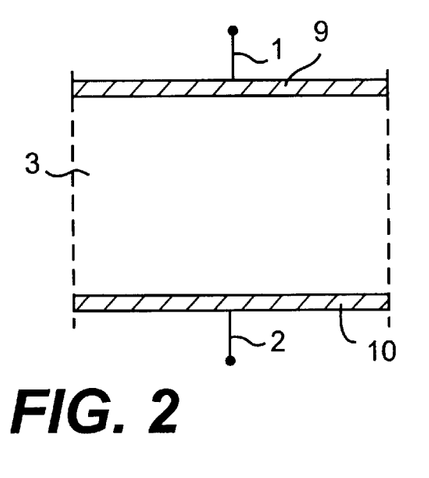
FIG. 2 is a schematic cross-section view of a device according to a second preferred embodiment of the invention.

FIG. 2 illustrates a device according to another preferred embodiment of the invention, which differs from that shown in FIG. 1 only by the arrangement of two second layers 9, 10 of SiC on opposite sides of the diamond layer 3, one of the layers 9 is of n-type (doped with donors) and the other 10 of p-type (doped with acceptors) and there is no means for generating free charge carriers by irradiation or electron bombardment. The doping concentration may typically be $10^{17}$–$10^{19}$ cm$^{-3}$ and examples of suitable donors are N and P and acceptors B and Al.

Figure 3:
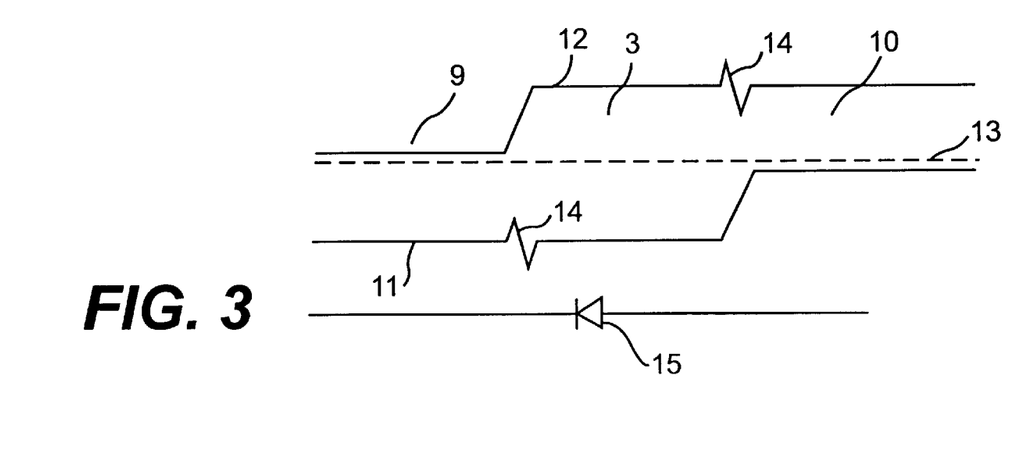
FIG. 3 is a graph showing the extension of the valence band and the conduction band in the device according to FIG. 2.

The band diagram of the device according to FIG. 2 is shown in FIG. 3. In this figure the extension of the upper limit of the valence band 11 and the lower limit of the conduction band 12 is shown from the left to the right through the n-type layer 9 of SiC, the layer 3 of diamond and the p-type layer 10 of SiC. The Fermi-level 13 is shown by the dashed line and is in the SiC layer 9 determined by the donor level and in the layer 10 by the acceptor level. It is shown that the energy gap between the valence band and the conduction band in the SiC-layers is slightly larger than half the band gap in diamond, approximately 3,2 eV (depending on the polytype) compared to 5,4 eV. This fact results in good alignment of the edges of the conduction band 12 at the heterojunction between the diamond layer 3 and the p-type-SiC layer 10 as well as a good alignment of the valence bands 11 at the heterojunction between the diamond layer 3 and the n-type-SiC layer 9 except for a minor thin barrier 14 at the interfaces as a consequence of band bending. The band bending effect can be minimized by doping of the diamond at the interface. This band gap structure will be of importance for a device of the type shown in FIG. 4 and illustrated by means of the energy band diagram of FIG. 5. It is illustrated by a symbol for a rectifying diode 15, that the device according to FIG. 2 will be in a conducting state when a voltage is applied across the terminals 1, 2 with a negative potential at the terminal 1 and a positive at the terminal 2. so that electrons from the layer 9 will move through the diamond layer to the layer 10 and holes will move in the opposite direction. The device will be in a blocking state when the direction of the voltage across the terminals is changed.

Figure 4:
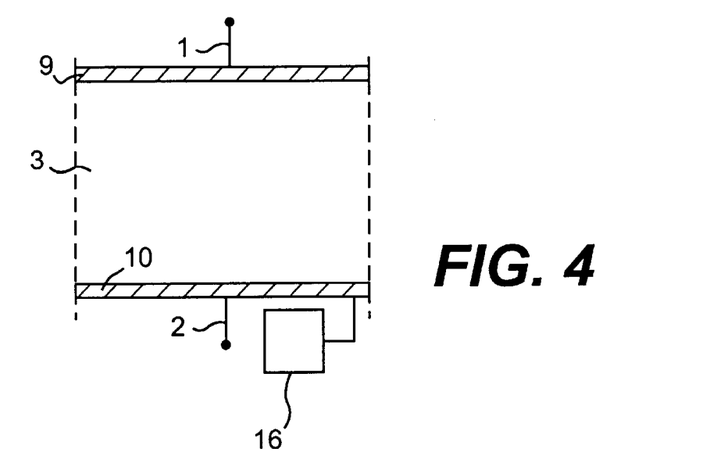
FIG. 4 is a schematic cross-section view of a device according to a third preferred embodiment of the invention.
Figure 5:
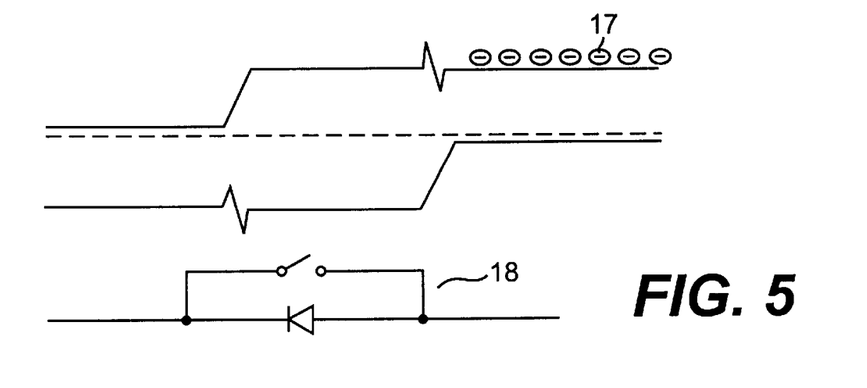
FIG. 5 is a graph showing the extension of the valence band and the conduction band in the device according to FIG. 4.

The device shown in FIG. 4 differs from that shown in FIG. 2 by the fact that it has a means 16 adapted to generate free charge carriers in the form of minority charge carriers, i.e. electrons, in the p-doped SiC-layer 10. Means 16 may be any type of voltage source able to inject electrons into the layer 10. As illustrated in FIG. 5 these electrons 17 will reside in the conduction band and are thereby active charge carriers. It is only necessary to apply a low voltage across the terminals 1, 2 falling from the terminal 1 to 2, accordingly in the reverse direction of the "diode" for a transport of electrons 17 into the diamond layer 3 by tunnelling through the barrier 14 and then through the diamond layer to the SiC-layer 9, where they will create holes injected into the diamond layer for transport in the opposite direction. Accordingly, when a voltage is applied in the "reverse" direction over the device according to FIG. 4 the device will be in a conducting state as long as means 16 is injecting free charge carriers in the form of electrons into the layer 10 and will switch to a blocking state when the injection of the minority charge carriers is stopped. This switching process will be very fast. Accordingly, the device will have the equivalent structure 18 shown in FIG. 5, which may be very useful in some high power applications.

Figure 6:
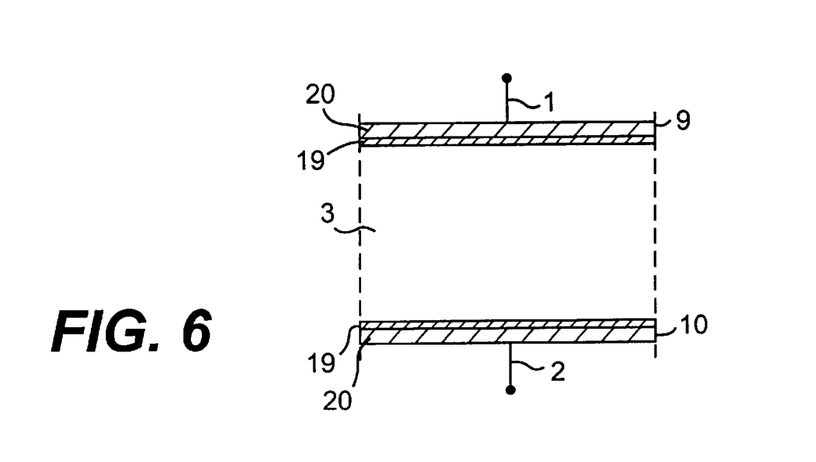
FIG. 6 is a schematic cross-section view of a device according to a fourth preferred embodiment of the invention.

A device according to a fourth preferred embodiment of the invention is very schematically shown in FIG. 6, and the main difference between this device and those shown in FIGS. 2 and 4 is that the layers 9 and 10 are made of two sub-layers, namely a first thin layer 19 of crystalline SiC next to the diamond layer 3 and a thicker layer 20 of silicon on top thereof. In this embodiment the thin layer of SiC is used for the ability of SiC to form an interface with excellent properties to diamond, and the thicker layer of Si is arranged on top thereof, since it may be considerably easier to grow a layer of that thickness of Si than of SiC at a growth rate and under conditions making the fabrication of the device interesting from the commercial point of view. The SiC-layer 19 may be as thin as one or a few atom layers resulting automatically from depositing Si-atoms on the surface of the diamond layer.

Figure 7:
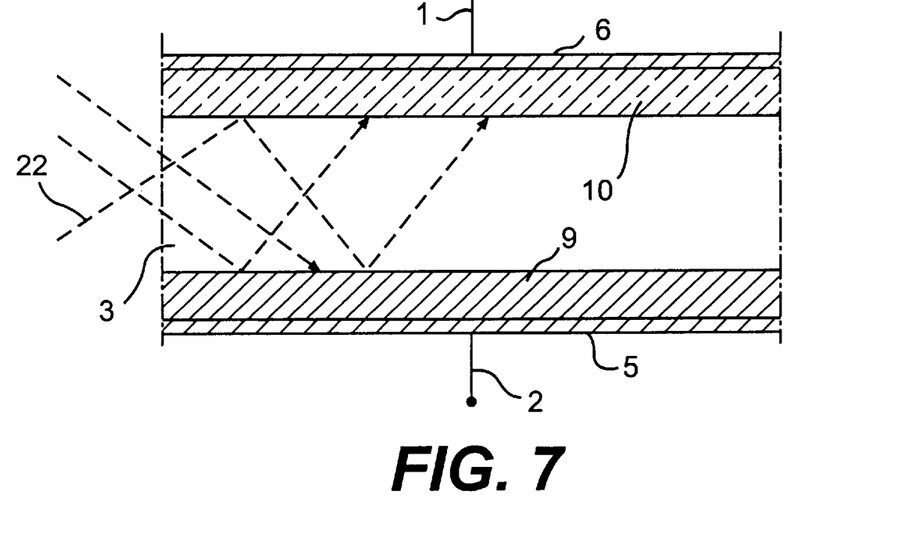
FIG. 7 is a schematic cross-section view of a device according to a fifth preferred embodiment of the invention.

The device shown in FIG. 7 has the same main structure with respect to the layers as the device shown in FIG. 4, but opposite contact layers 5, 6 has also been shown here. However, this device has a different means 22 adapted to generate free charge carriers in the form of minority charge carriers in the SiC-layers 9 and 10. More exactly, the diamond layer 3 of this diamond-SiC-hetero structure is utilized as an optical conductor, and the layer of intrinsic diamond is irradiated laterally with photons scattered at the interface between the diamond layer and the respective SiC-layer while generating free charge carriers close to said interface. The geometry guaranties that all the charge carriers are generated close to the interface. The energy of the photons is selected to values in the interval between the band gaps for SiC and diamond, i.e. between about 3 and 5,5 eV. It is advantageous that 3 eV is sufficient, since these wave-lengths are easier to generate by means of lasers and other light sources than photons having wavelengths corresponding to at least 5,5 eV required for generating electron-hole pairs in diamond.

Figure 8:
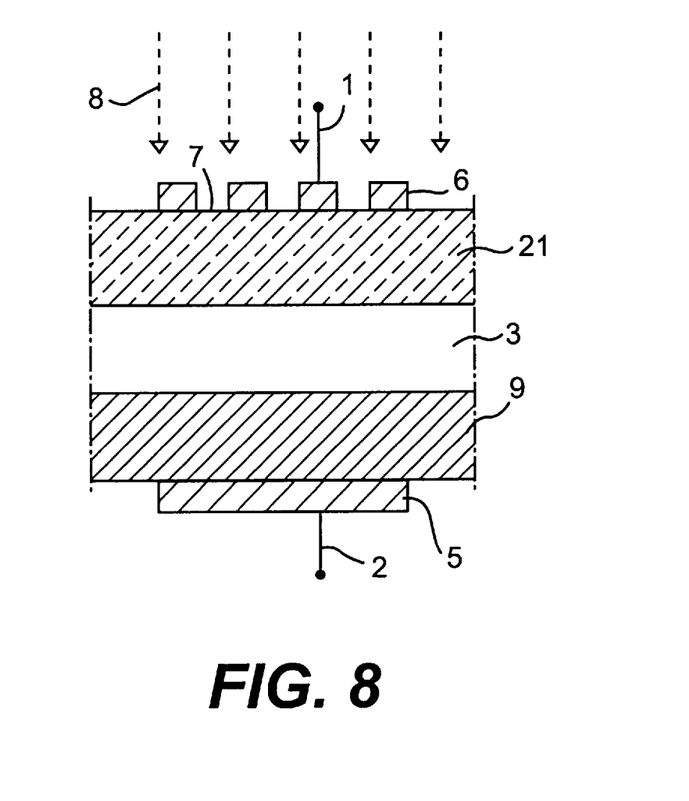
FIG. 8 is a schematic cross-section view of a device according to a sixth preferred embodiment of the invention.
Figure 9:
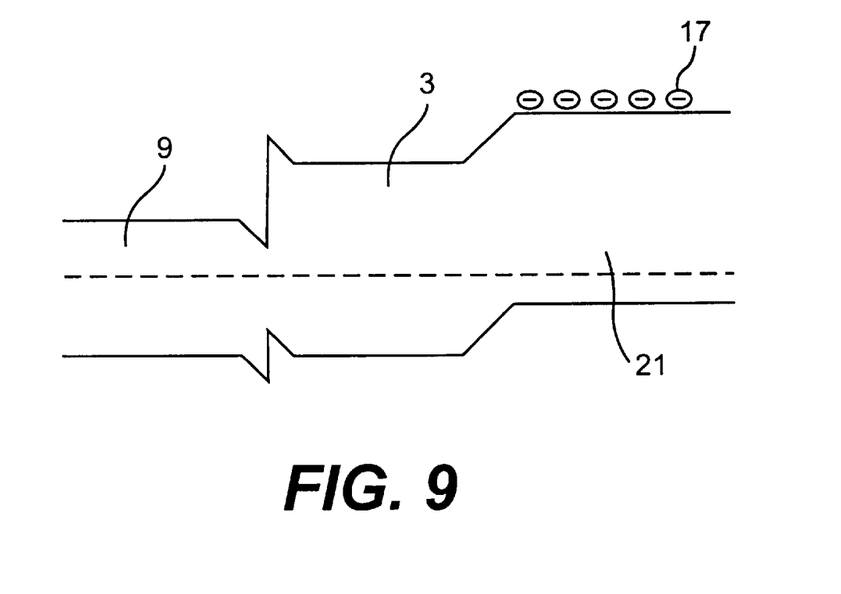
FIG. 9 is a graph showing the extension of the valence band and the conduction band in the device according to FIG. 8.

FIG. 8 also illustrates a so-called p-i-n diode having the same general function as the diodes according to FIGS. 4 and 7, but with the difference that the layer 10 here is replaced by a p-doped diamond layer 21 which is irradiated with photons 8 for generation of minority charge carriers in the form of electrons at conduction band level, as illustrated in FIG. 9. The layer 9 is a n-doped SiC-layer but it could in practise be any n-doped semiconductor with a band gap more narrow than diamond. The p-doped diamond layer 21 and the n-doped SiC-layer 9 can be grown by CVD on an intrinsic diamond substrate 3, or the p-type diamond layer may be formed by ion-implantation of acceptors into a substrate of intrinsic diamond.

The general function of this diode is the same as thoroughly explained through FIGS. 4 and 5, but with another means for generating the free charge carriers. However, the device according to this embodiment has some important advantages. This diode could be photo-activated by UV-radiation, which would penetrate the sample through the doped diamond surface 7. There are some difficulties associated with absorption of the UV-light by SiC-layers, and these may be reduced by using a p-doped diamond layer thus eliminating the need to illuminate the intrinsic layer from the side as in the embodiment according to FIG. 7. Furthermore, band bending effects are reduced and fabrication is simplified, since only one hetero-junction is formed, i.e. between the intrinsic diamond and the n-doped layer 9.

Figure 10:
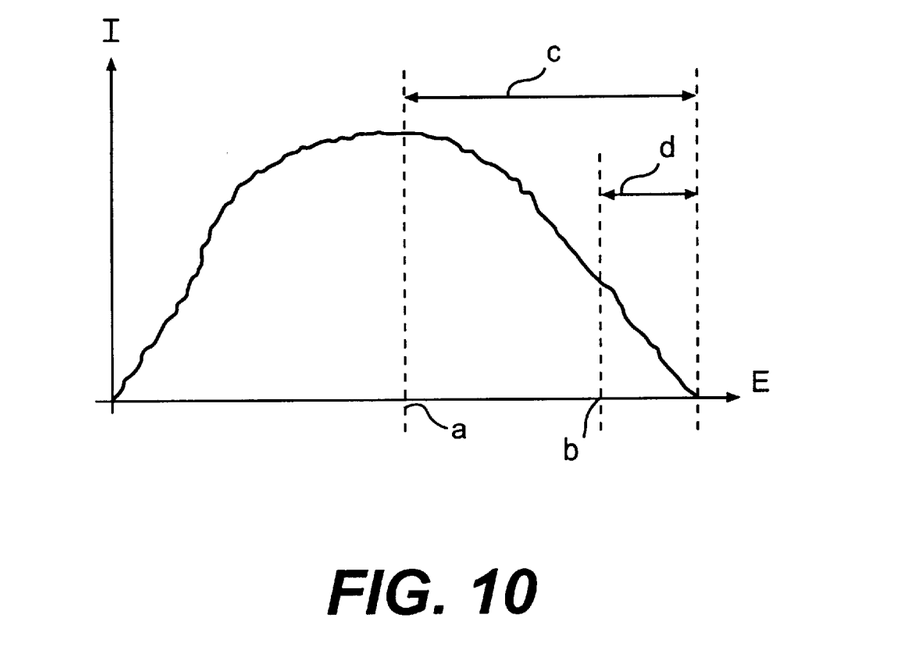
FIG. 10 is a graph of the intensity versus energy of the irradiation through photon radiation in the device according to FIG. 8.

This reverse-bias diode can be used as photo-activated switch. Under reverse bias the diode blocks current flow, however, when illuminated with high intensity UV-light it can become conducting due to generation of charge carriers 17 in the intrinsic diamond layer. Such a device comprised of sandwiched diamond and SiC-layers makes optimal use of the power input in the form of UV-radiation to trigger the switch, since short wave-lengths generate charge carriers in the diamond, while longer wave-length serve to produce carriers in the SiC-layer. Thus, a greater portion of the UV-spectrum is used for charge carrier generation, which is illustrated in FIG. 10, which is a graph of the intensity I of the UV-radiation versus the energy E. a and b are the lower limits for generation of charge carriers in SiC and diamond, respectively, namely 3,2 eV and 5,4 eV. Accordingly, it is now possible to use the portion indicated by the arrow c, and in the portion indicated by the arrow d charge carriers may efficiently be generated in the diamond layer avoiding the absorption problem of SiC.

Figure 11:
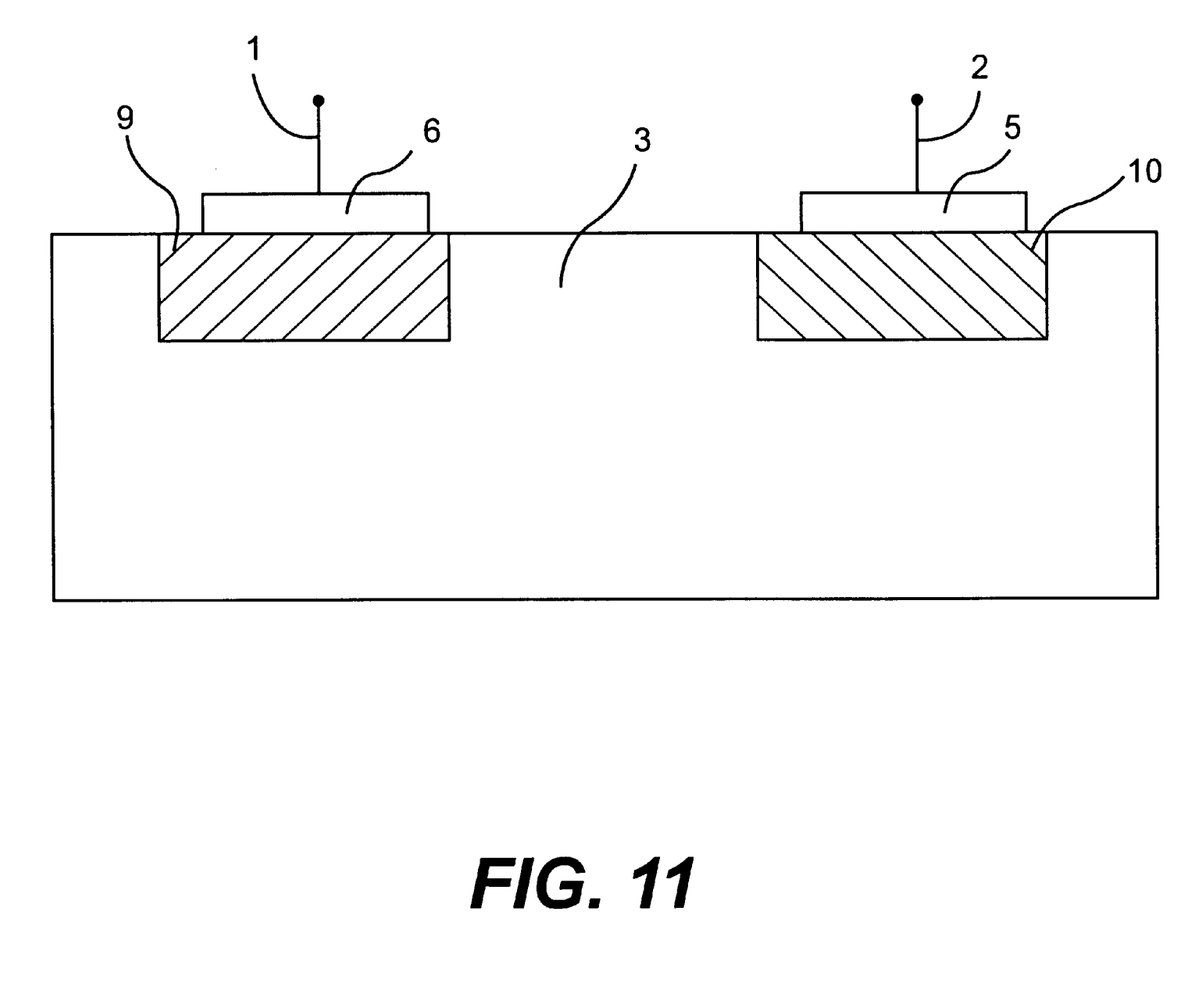
FIG. 11 is a schematic cross-section view of a device according to a seventh preferred embodiment of the invention

FIG. 11 illustrates a device constituting a minor modification of the device according to FIG. 2 by arranging the two second layers 9, 10 and the contacts 5, 6 on the same side of the diamond layer 3 separated by the latter. This embodiment may of course also be provided with any of the means for generating free charge carriers shown in FIGS. 1, 4 or 8 or other such means discussed above.

The invention is of course not in any way restricted to the preferred embodiments described above, but many possibilities of modifications thereof would be apparent to a man with ordinary skill in the art without departing from the basic idea of the invention as defined in the claims.

It is for instance evident that the different embodiments shown in the figures may be combined, so that for instance the minority charge carriers in the device according to FIG. 4 may be created by irradiation of light or electron bombardment of appropriate energies, the layers on the opposite sides of the diamond layer in the embodiments according to FIGS. 2 and 4 may have the appearance according to FIG. 6 and so on.

What is claimed is:

1. A device having two terminals interconnected by material layers for switching between a current conducting state and a state blocking transport of charge carriers between said terminals upon application of a voltage thereacross, said material layers comprising a first layer made of intrinsic diamond and a second layer arranged next to the first layer, the device also comprising means for switching to said conducting state by providing free charge carriers in said second layer for transport through the first, diamond layer through said voltage and switching back to said blocking state by terminating the provision of said free charge carriers for said transport, said first diamond layer being adapted to take a major part of the voltage across said terminals in said blocking state, and wherein said second layer is of a material having a substantially smaller energy gap between the valence band and the conduction band than diamond, and said switching means causes said switching between the conducting the blocking state by generating free charge carriers only in the second layer for injection thereof into the first layer and by terminating said generation, respectively.

2. A device according to claim 1, wherein said means for generating free charge carriers irradiates the second layer with photon radiation having sufficient energy to create free charge carriers in the second layer.

3. A device according to claim 1, wherein said means is adapted to generate free charge carriers by irradiating the second layer with electrons having an energy sufficiently high for creating free charge carriers in the second layer.

4. A device according to claim 1, wherein said means for creating free charge carriers in the second layer injects free charge carriers into the second layer.

5. A device according to claim 1, comprising two second layers separated by the first layer of diamond.

6. A device according to claim 1, comprising two second layers arranged on the same side of the first layer of diamond.

7. A device according to claim 1, wherein said means provides free charge carriers in said second layer by doping thereof.

8. A device according to claim 1, wherein said second layer is, at least next to the first layer, made of crystalline SiC.

9. A device according to claim 7, wherein said second layer has two sub-layers including a thin first sub-layer of SiC arranged between the first layer and a considerably thicker second sub-layer of Si.

10. A device according to claim 7, further comprising between the respective terminal and the first layer and next to the first layer, two second layers of a semiconductor material, and two layers of semiconductor material being doped according to mutually opposite conductivity-types, n and p, respectively, for conducting a current when a voltage is applied in a forward direction across said terminals by transport of the negative and positive charge carriers provided in said layers of semiconductor material by said doping.

11. A device according to claim 10, wherein said means is adapted to cause a switching between a conducting state and a blocking state when a voltage is applied across said terminals in the reverse direction by generating free charge carriers in the form of minority charge carriers in at least one of said layers of semiconductor material and stopping this generation, respectively.

12. A device according to claim 9, wherein the two layers of semiconductor material are, at least next to the first layer, made of crystalline SiC.

13. A device according to claim 10, wherein one of the second layers is made of p-doped diamond.

14. A device according to claim 13, wherein the other semiconductor layer is made of crystalline SiC.

15. A device according to claim 11, wherein said means for generating free charge carriers irradiates the first layer laterally with photons traveling laterally in said first layer while being scattered at the interfaces to said layers of semiconductor material and having sufficient energy to create free charge carriers in the form of minority charge carriers in at least one of said layers semiconductor close to said interface.

16. A device according to claim 10, wherein said layers of semiconductor material are made of at least two sub-layers, namely a thin first sub-layer of SiC arranged between the first layer and a considerably thicker second sub-layer of Si.

17. A device according to claim 2, wherein said first layer of diamond has a substantially larger thickness than the other layers of the device.

18. A device according to claim 11, said device being designed for switching high voltages and/or currents.

19. A device according to claim 11, wherein said diamond layer is designed to hold voltages at least up to 5 kV in said blocking state.

* * * * *